United States Patent
Karinca et al.

(10) Patent No.: US 10,819,214 B2
(45) Date of Patent: Oct. 27, 2020

(54) ACTIVE COMPENSATION CIRCUIT AND SYSTEM

(71) Applicant: TDK Electronics AG, Munich (DE)

(72) Inventors: Yasin Karinca, Burgau (DE); Michael Vornkahl, Gerstetten (DE)

(73) Assignee: TDK Electronics AG, Munich (DE)

( * ) Notice: Subject to any disclaimer, the term of this patent is extended or adjusted under 35 U.S.C. 154(b) by 0 days.

(21) Appl. No.: 16/492,091

(22) PCT Filed: Mar. 6, 2018

(86) PCT No.: PCT/EP2018/055483
§ 371 (c)(1),
(2) Date: Sep. 6, 2019

(87) PCT Pub. No.: WO2018/162488
PCT Pub. Date: Sep. 13, 2018

(65) Prior Publication Data
US 2020/0212791 A1     Jul. 2, 2020

(30) Foreign Application Priority Data

Mar. 8, 2017   (DE) .................. 10 2017 104 894

(51) Int. Cl.
*H02M 1/00* (2006.01)
*H02M 1/12* (2006.01)
(Continued)

(52) U.S. Cl.
CPC .............. *H02M 1/12* (2013.01); *H02M 1/15* (2013.01); *H02M 1/44* (2013.01); *H03H 7/427* (2013.01); *H02M 2001/123* (2013.01)

(58) Field of Classification Search
CPC ............ H02M 1/12; H02M 1/15; H02M 1/44; H02M 2001/123; H03H 7/427
See application file for complete search history.

(56) References Cited

U.S. PATENT DOCUMENTS 7,288,943 B2 * 10/2007 Matthiessen ......... A61B 5/0536
                                                      324/628
9,717,431 B2    8/2017 Batzer et al.
(Continued)

FOREIGN PATENT DOCUMENTS

DE    102005031751 A1   1/2007
DE    102014219943 B4   3/2017
(Continued)

OTHER PUBLICATIONS

Heldwein, M.L. et al., "Implementation of a Trasformerless Common-Mode Active Filter for Offline Converter Systems," IEEE Transactions on Industrial Electronics, vol. 57, No. 5, May 2010, 15 pages.

*Primary Examiner* — Adolf D Berhane
*Assistant Examiner* — Afework S Demisse
(74) *Attorney, Agent, or Firm* — Slater Matsil, LLP

(57) ABSTRACT

An active compensation circuit is disclosed. In an embodiment a circuit includes a first compensation stage and at least one other compensation stage, wherein each of the first compensation stage and the at least one other compensation stage includes a sensor configured to provide a sensor signal being representative of a current flowing in one or more phases, a controlled current sink configured to supply a compensation current as a function of the sensor signal and an active amplifier element configured to provide a frequency response of an open circuit voltage amplification and/or is to supply a maximal output current, wherein the frequency response differs from a frequency response of at least one other active amplifier and/or wherein the maximal output current differs from a maximal output current of at least one other active amplifier.

20 Claims, 3 Drawing Sheets

(51) Int. Cl.
  *H02M 1/15* (2006.01)
  *H02M 1/44* (2007.01)
  *H03H 7/42* (2006.01)

(56) References Cited

U.S. PATENT DOCUMENTS

2003/0184459 A1* 10/2003 Engl .................. H03F 3/45753
   341/120
2013/0147419 A1   6/2013 Sakai et al.
2014/0184315 A1   7/2014 Wallace et al.
2018/0048223 A1   2/2018 Pei et al.

FOREIGN PATENT DOCUMENTS

| EP | 2945268 A1    | 11/2015 |
| EP | 3113361 A1    | 1/2017  |
| WO | 0007274 A2    | 2/2000  |
| WO | 2012053992 A4 | 4/2012  |
| WO | 2016173229 A1 | 11/2016 |

* cited by examiner

ACTIVE COMPENSATION CIRCUIT AND SYSTEM

This patent application is a national phase filing under section 371 of PCT/EP2018/055483, filed Mar. 6, 2018, which claims the priority of German patent application 102017104894.4, filed Mar. 8, 2017, each of which is incorporated herein by reference in its entirety.

TECHNICAL FIELD

The invention relates to an active compensation circuit for suppressing common-mode interference. The active compensation circuit can be coupled to a power network and an electric installation. The invention further relates to a system, which comprises the active compensation circuit.

BACKGROUND

To supply installations that have electric machines, frequency inverters are used increasingly. Higher leakage currents occur to an increasing extent in modern frequency inverters. Whereas the leakage currents in drive systems were a few 100 mA in the past, in newer drive systems leakage currents in the order of several amperes occur. However, even capacitors of the lines and network filters, which are necessary to maintain the electromagnetic compatibility (EMC) and are required to operate such electric installations, additionally generate leakage currents. A leakage current is an electric current that flows under normal operating conditions in an undesirable current path. The leakage currents are so-called common-mode interference.

To protect people, residual current circuit breakers, which are also termed RCD residual current protective devices, are used increasingly in electric installations. Residual current circuit breakers are designed to detect residual currents to ground and to switch the electric installation off if a maximum current is exceeded. A residual current is an electric current that flows across a given fault location due to an insulation fault.

A residual current circuit breaker cannot differentiate between leakage currents and residual currents. The leakage currents can cause the residual current circuit breaker to trigger, so that reliable operation of the electric installation cannot be guaranteed, nor can normative requirements be adhered to.

European Patent No. EP 2 945 268 A1 shows an active filter circuit with a high-pass filter, which supplies a correction signal, which is generated depending on a sensor signal filtered using the high-pass filter.

SUMMARY OF THE INVENTION

Embodiments provide an active compensation circuit for suppressing common-mode interference and a system that facilitates improved suppression of the common-mode interference.

According to a first aspect, embodiments provide an active compensation circuit for suppressing common-mode interference, wherein the active compensation circuit can be coupled to a power network and an electric installation. The power network and the electric installation are coupled directly or indirectly via one or more phases. The active compensation circuit has a first compensation stage and one or more other compensation stages. The first and at least one of the other compensation stages each comprise a current sensor for supplying a sensor signal, which is representative of a current that flows in the phase or in the phases. The first and the at least one other compensation stage each further comprise a controlled current sink with an active amplifier element. The controlled current sink is designed to supply a compensation current as a function of the sensor signal detected. The active amplifier element of the first compensation stage and/or at least one of the other compensation stages has a frequency response of an open circuit voltage amplification, which differs in each case from a frequency response of the active amplifier elements of the other compensation stages of the active compensation circuit, and/or the active amplifier element of the first compensation stage and/or at least one of the other compensation stages is designed to provide a maximal output current, which differs in each case from a maximal output current of the active amplifier elements of the other compensation stages of the active compensation circuit.

The active compensation circuit thus advantageously enables higher attenuation of the common-mode interference. The leakage currents can be compensated better. On the one hand, higher leakage currents can be compensated. An output current capacity of the compensation circuit, i.e., a maximal total output current of the active compensation circuit, can easily be adjusted by a suitable choice of the number of compensation stages. The use of a plurality of compensation stages enables compensation and thus the suppression of very high leakage currents. On the other hand, the compensation of the leakage currents can be better adjusted via a further frequency. The use of a plurality of compensation stages permits the compensation stages to be adjusted individually to predetermined requirements in respect of frequency-dependent attenuation behavior. The adjustment can be made very simply by using different component properties. The component properties can comprise, in particular, a bandwidth or a maximal output current of the active amplifier element.

The combination of various component properties of the amplifier stages makes a more effective compensation circuit possible, which permits improved attenuation of the common-mode interference in a desired frequency band in particular. The use of active amplifier elements permits a very compact construction. Compared with a circuit in which predominantly passive elements determine the filter properties or the attenuation properties, a volume and a weight of the compensation circuit can be significantly reduced. Furthermore, a linearity of the active compensation circuit as a function of the frequency is far more stable than in circuits in which predominantly capacitors and inductors as filter elements determine the filter properties or the attenuation properties, as inductors can exhibit strongly non-linear behavior on account of their saturation characteristics.

In comparison to conventional passive filters, a reactive current portion, which flows through interference-suppression capacitors due to the network frequency, can be reduced.

Compared with a circuit in which predominantly passive elements determine the filter properties or the attenuation properties, the active compensation circuit can advantageously exhibit improved temperature behavior that is easy to control. For the active amplifier elements suitable cooling measures can simply be provided, which facilitate improved temperature behavior of the active amplifier elements.

The use of a plurality of compensation stages not only makes it possible to optimize the frequency response with regard to an individually supplied correction signal, but also to make a plurality of compensation currents available, which can each be adjusted in respect of their frequency response and their maximal amplitude. Since remaining leakage currents can each be measured afresh, it is also possible to compensate for component variations and/or tolerances that occur in the individual compensation stages, due to which very high attenuation of the common-mode interference or the leakage currents can be achieved.

The first compensation stage and the one or more other compensation stages can each have an identical circuit structure, but be dimensioned differently in part in respect of the component properties.

The different dimensioning of the compensation stages makes it possible in particular to adapt the first compensation stage to special requirements, in which a singular adjustment is more advantageous, and if applicable to configure the other compensation stages similarly to one another, in order to be able to fulfil certain bandwidth requirements in particular.

The sensor can be designed to detect a current that is representative of a sum of the common-mode currents, or the leakage currents, of all phases in relation to a reference potential, in particular in relation to ground.

The respective compensation current is preferably fed into the phases for compensating the respective leakage current that flows through the phase. To do this, the compensation current is preferably divided up accordingly, so that an identical share of the compensation current is fed into each phase. Alternatively a different division is also possible.

In an advantageous embodiment according to the first aspect, the active compensation circuit has an input for direct or indirect coupling to a load side, which comprises an electric installation, and an output for direct or indirect coupling to a network side, which comprises the power network, and the first compensation stage and the at least one other compensation stage are arranged cascaded between the input and the output of the active compensation circuit. This permits simple circuit realization and dimensioning.

In another advantageous embodiment according to the first aspect, the first compensation stage is coupled to the input of the active compensation circuit and forms an input stage of the active compensation circuit, and the active amplifier element of the first compensation stage is designed to supply a higher maximal output current than the amplifier element of the at least one other compensation stage or than the active amplifier elements of the other compensation stages. The amplifier elements of the other compensation stages can supply identical or different maximal output currents.

In another advantageous embodiment according to the first aspect, the other compensation stage, which is coupled to the output of the active compensation circuit and forms an output stage of the active compensation circuit, comprises an active amplifier element that has a greater bandwidth of the open circuit voltage amplification than the active amplifier elements of the upstream compensation stages. This makes it possible in particular to optimize interference suppression at high frequencies. The amplifier elements of the other compensation stages can have identical or different bandwidths of the open circuit voltage amplification.

In another advantageous embodiment according to the first aspect, the respective sensor of the first and the at least one other compensation stage has a current transformer, which is arranged and designed to supply a sensor signal, which is representative of a total current that flows in a predetermined measuring region of the sensor through the phase or phases. The sensor is preferably coupled in a predetermined measuring region to the phase or phases, in particular inductively coupled to detect the currents that flow through the phase or phases. The current sensor makes it possible to supply a sufficiently precise control signal for controlling the compensation current of the respective compensation stage.

In another advantageous embodiment according to the first aspect, the respective current transformer has a summation current transformer and the total current forms the sum of the individual leakage currents that flow in the individual phases. This permits simple detection of the leakage currents.

In another advantageous embodiment according to the first aspect, the first and the at least one other compensation stage are each designed to supply their compensation current such that in relation to the total current, which flows in the predetermined measuring region of the sensor through the phase or phases, it is phase-shifted by approximately 180° or by 180° and is of approximately the same amplitude or of the same amplitude. Due to tolerances and/or measuring inaccuracies, no complete compensation can be achieved here in most cases, as is known. The term "approximately" therefore describes a discrepancy that can occur in the context of the given tolerances and/or measuring inaccuracies.

In another advantageous embodiment according to the first aspect, the sensor has a first sensor connection and a second sensor connection, and the controlled current sink comprises a load resistor, which is coupled between the first sensor connection and the second sensor connection and which represents a load of the current transformer. This makes it possible to supply an input signal for the controlled current sink in a simple manner.

In another advantageous embodiment according to the first aspect, the amplifier element comprises a voltage follower, the input voltage of which is representative of a voltage, which drops across the load resistor, and the amplifier output of which is coupled via an output resistor to an output of the controlled current sink to supply the compensation current. This permits a simple realization of the current sink.

In another advantageous embodiment according to the first aspect, the first compensation stage and/or at least one of the other compensation stages each have a plurality of controlled current sinks, which are connected in parallel. This has the advantage that higher leakage currents can be compensated by the respective stage.

According to a second aspect, embodiments provide a system, which has a power network and an electric installation, which are coupled directly or indirectly via one or more phases. Furthermore, the system has an active compensation circuit according to the first aspect, wherein the respective output of the first compensation stage and of the at least one other compensation stage is coupled directly or indirectly to the phase or phases.

Advantageous embodiments of the first aspect are valid in this case also for the second aspect.

BRIEF DESCRIPTION OF THE DRAWINGS

Exemplary embodiments of the invention are explained below by means of the schematic drawings.

These show.

Elements of the same construction or function are provided with the same reference signs across all figures.

DETAILED DESCRIPTION OF ILLUSTRATIVE EMBODIMENTS

Figure 1:
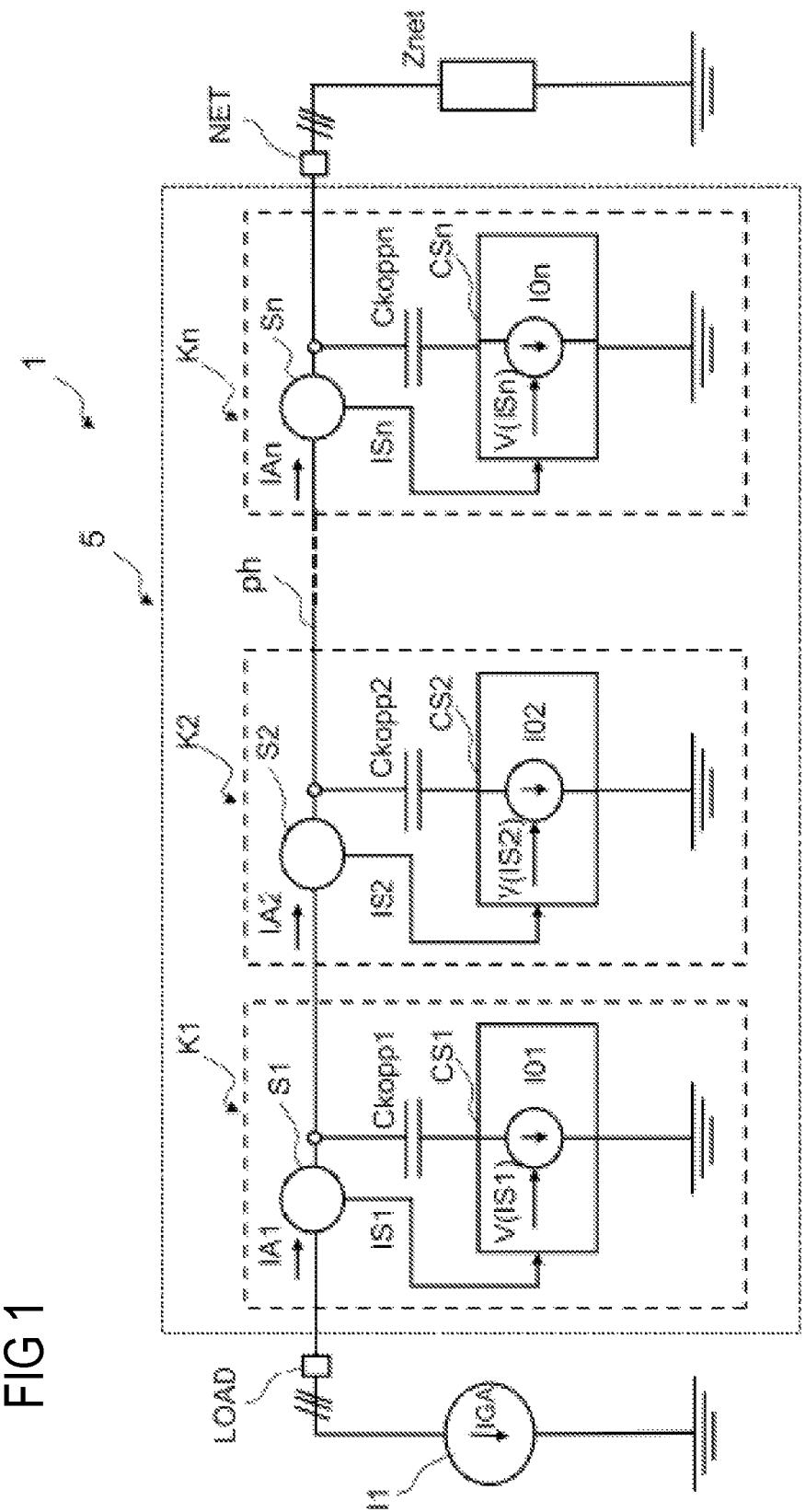
FIG. 1 shows a block circuit diagram of a system with an exemplary active compensation circuit.

FIG. 1 shows a block circuit diagram of a system 1 with an exemplary active compensation circuit 5. The system 1 comprises a drive system, for example. The active compensation circuit 5 is designed to suppress common-mode interference, wherein the common-mode interference can comprise leakage currents in particular.

The system 1 comprises a power network and an electric installation, which are coupled directly or indirectly via one or more phases ph or phase conductors. The phase ph or the phases ph each have a load connection LOAD and a network connection NET. The electric installation is coupled via the load connections LOAD and the power network via the network connections NET to the phase or phases ph.

In the exemplary embodiment shown, the system 1 has three phases ph1, ph2, ph3, for example. Alternatively the system 1 can have one, two, four or more phases.

The active compensation circuit 5 has an input connection IN and an output connection OUT. The active compensation circuit 5 is coupled via the input connection IN to the load connections LOAD of the phases ph and via the output connection OUT to the network connections NET of the phases ph.

In the depiction in FIG. 1, only a common-mode model is shown for simplified visualization, in which all phases ph are combined into one line. A first current source I1, which is coupled to the input connection IN of the active compensation circuit 5, represents a total leakage current IGA generated by the load. A network impedance Znet, which is coupled to the output connection OUT of the active compensation circuit 5, represents a resulting impedance of the power network.

The active compensation circuit 5 comprises a first compensation stage K1 and at least one other compensation stage K2, Kn, wherein the compensation stages K1, K2, Kn are arranged cascaded.

The cascaded compensation stages K1, K2, Kn are arranged between the input connection IN and the output connection OUT of the active compensation circuit 5. The first compensation stage K1 is arranged on the input side and forms an input stage of the active compensation circuit 5. The first compensation stage K1 is preferably designed to make a highest maximal compensation current IO1 available and thus has a higher maximal output current than the other further compensation stages K2, Kn.

Alternatively or in addition, it is possible that the compensation stage Kn, which is coupled to the output of the active compensation circuit 5 and forms an output stage of the compensation circuit 5, has a highest frequency bandwidth with regard to the interference suppression of high-frequency components of the common-mode interference, or of the leakage currents.

Figure 2:
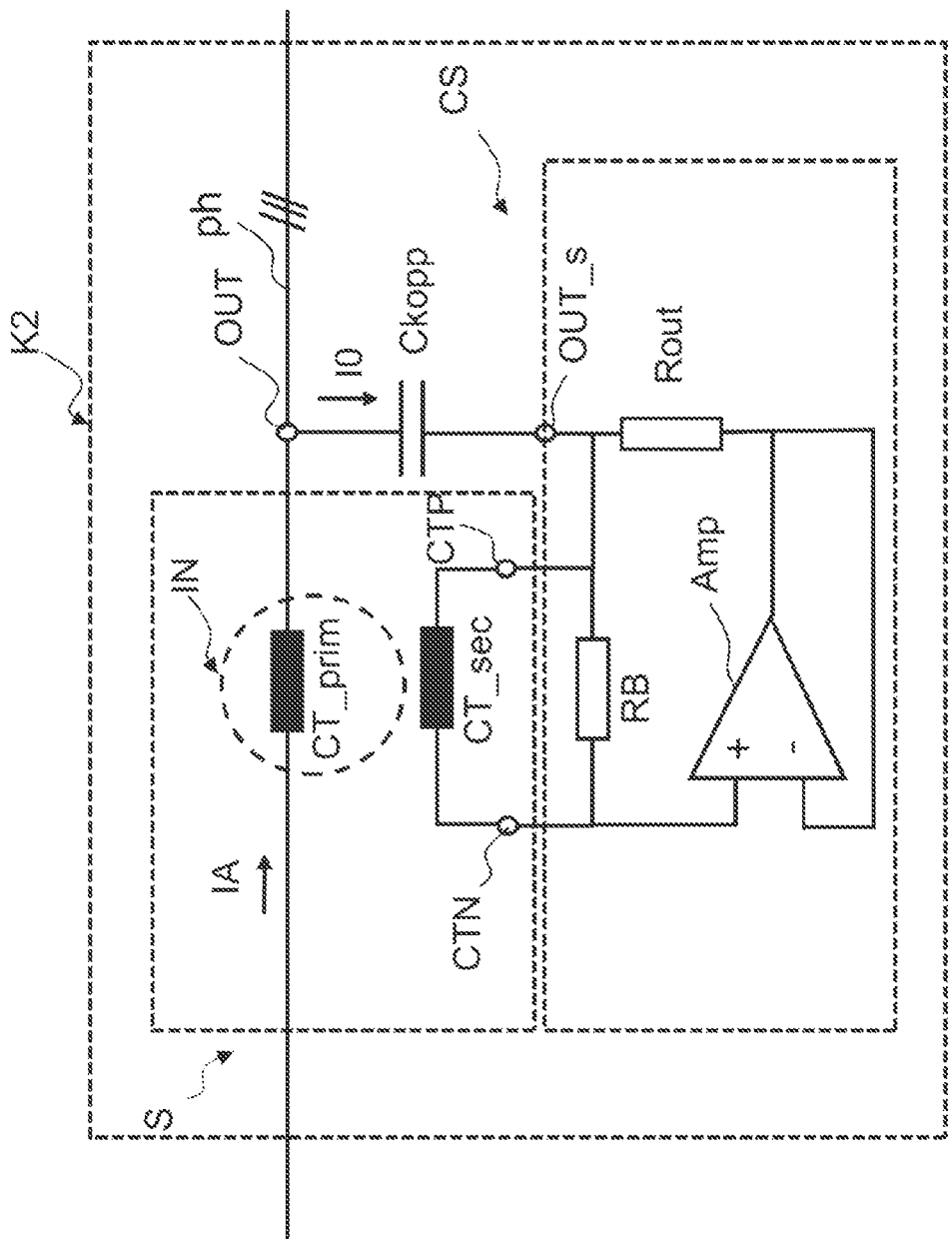
FIG. 2 shows a block circuit diagram of an exemplary compensation stage.

FIG. 2 shows a block circuit diagram of an exemplary compensation stage K.

The first and the at least one other compensation stage K1, K2, Kn each have a sensor S, preferably a current sensor. The respective sensor S is arranged and designed to supply a sensor signal IS, which is representative of a total current, which flows in the phase ph or the phases ph.

The respective compensation stage K is connected to the phase or phases ph. The compensation stage K is coupled on the load side, for example, to the phase or phases ph via the sensor S. The sensor S is preferably coupled in a predetermined measuring region to the phase or phases ph, in particular inductively coupled to detect the currents that flow through the phase ph or the phases ph.

The sensor S is designed, for example, to detect a total current, which flows in the phase ph or the phases ph in the predetermined measuring region of the sensor S, and to supply the sensor signal IS as a function of the total current, wherein the total current comprises the leakage currents that flow in the individual phases ph.

The sensor S_1 of the first compensation stage K1 is arranged, for example, to detect the total leakage current IGA. The sensors S_2, S_n of the downstream compensation stages K2, Kn are arranged and designed, for example, to detect the respective remaining leakage currents, which were not completely compensated on account of non-optimal compensation of the respective upstream compensation stage K1, K2.

The respective current sensor has a current transformer, for example. The current transformer is designed as an inductive current transformer, for example. The current transformer has a primary side and a secondary side, which are depicted in the equivalent circuit shown in FIG. 2 as a primary inductor and secondary inductor.

The inductive current transformer has, for example, a primary winding CT_prim for each phase ph with just one or a few turns in each case, through which the current that is to be measured flows. The current transformer further has a secondary winding CT_sec with a greater number of turns. The secondary current is reduced compared with the primary current that is to be measured, to be precise in inverse proportion to the ratio of the number of primary and secondary turns.

The current transformer is designed as a ring-type transformer, for example, in which the primary winding CT_prim comprises a phase ph guided through a toroidal core of the transformer, which corresponds to a single turn. The current transformer thus has three primary windings CT_prim by way of example. When the leakage currents flow through the primary windings CT_prim of the current transformer, a current is induced in the secondary winding CT_sec, which current is a function of the number of turns n of the secondary winding CT_sec.

The respective compensation stage K is designed to supply a compensation current IO as a function of the leakage currents detected by the sensor S of the respective compensation stage K and to feed it into the phases ph. The compensation stage K is preferably designed to supply the compensation current Io in such a way that with regard to the resulting leakage current IA, which comprises the sum of the leakage currents detected by the sensor S of the respective compensation stage K, it is phase-shifted by approximately 180° or phase-shifted by 180° and in addition it is approximately of the same amplitude or is of the same amplitude, so that the respective compensation current Io at least approximately compensates the total leakage current IGA or resulting leakage current IA, detected by the sensor S, of the upstream compensation stage K1, K2, and no or only a small remaining leakage current remains as the resulting leakage current IA of the compensation stage K.

Due to tolerances and/or measuring inaccuracies, no complete compensation can be achieved in this case, as is known, in particular with only a single compensation step. The compensation current Io can thus differ slightly from the current to be compensated.

The compensation current Io is preferably divided accordingly, so that an equal portion of the compensation current Io is fed into each phase ph. Alternatively another division is also possible.

The respective compensation stage K has a controlled current sink CS, for example, a voltage-controlled current sink. Alternatively, the respective compensation stage K can have a plurality of controlled current sinks CS, which are connected in parallel. An output OUT_s of the controlled current sink CS is coupled via a coupling capacitor arrangement CKopp, for example, to the phases ph of the network. The coupling capacitor arrangement CKopp is used, for example, to isolate a coupling to the phases ph. The coupling capacitor arrangement facilitates a frequency-dependent coupling of the controlled current sink CS to the respective phase ph. In particular, direct current components can be prevented from being coupled into the phases ph in this way.

The respective compensation stage K is thus coupled on the network side to the phase ph or the phases ph to feed in the compensation current Io.

The controlled current sink CS is designed to supply the compensation current Io as a function of the detected sensor signal IS. The controlled current sink CS comprises an active amplifier element Amp.

The active amplifier element Amp of the first compensation stage K1 has another frequency response of an open circuit voltage amplification and/or is designed to supply another maximal output current than the active amplifier element or elements Amp of the at least one other compensation stage K2, Kn.

The active amplifier element Amp of the first compensation stage K1 is preferably designed to supply a higher maximal output current than the active amplifier element or elements Amp of the other compensation stages K2, Kn.

The controlled current sink CS has a load resistor RB, which is coupled between a first sensor connection CTN and a second sensor connection CTP of the secondary winding CT_sec of the sensor, so that the load resistor RB and the secondary winding CT_sec of the current transformer form a circuit.

The load resistor RB represents a load of the current transformer, for example. In current transformers, the impedance of the secondary circuit is described as the load. Since the resistor and the secondary winding CT_sec of the current transformer form a circuit, the current induced in the secondary winding CT_sec produces a voltage drop at the load resistor RB.

The amplifier element Amp of the controlled current sink CS comprises a voltage follower, for example. The amplifier element Amp is wired in this case such that the input voltage of the voltage follower is representative of the voltage that falls across the load resistor RB. The amplifier output of the voltage follower is coupled via an output Rout to the output OUT_s of the controlled current sink CS to supply the compensation current Io. The voltage follower comprises an operational amplifier, for example.

The voltage follower preferably has an amplification of A=1. Thus the same voltage falls across the output resistor Rout as is present at the input of the voltage follower or at the load resistor RB. So that the compensation current Io corresponds as closely as possible to the total leakage current IGA or the respective resulting leakage currents IA at the output of the respective upstream compensation stages K1, K2 and thus the highest possible attenuation results, the output resistance Rout is greater by the factor n, for example, which corresponds to the number of turns of the secondary winding CT_sec, than the load resistance RB.

Figure 3:
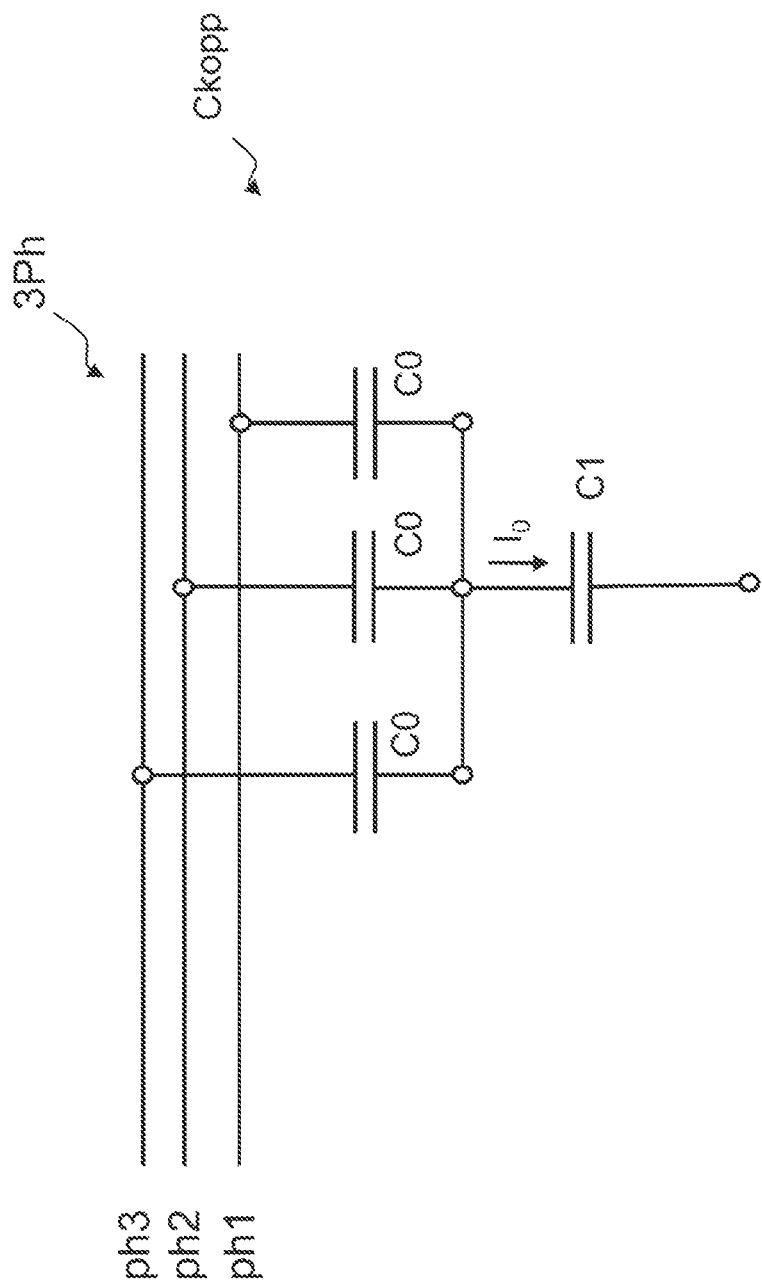
FIG. 3 shows an equivalent circuit of an exemplary coupling capacitor arrangement.

FIG. 3 shows an exemplary embodiment of the coupling capacitor arrangement Ckopp for a 3-phase arrangement 3 ph.

The coupling capacitor arrangement Ckopp a common capacitor Co and another capacitor C1 for each phase ph1, ph2, ph3. The other capacitors C1 are each coupled to one of the phases ph and to the common capacitor Co.

The invention claimed is:

1. An active compensation circuit comprising:
   a first compensation stage; and
   at least one other compensation stage,
   each of the first compensation stage and the at least one other compensation stage comprising:
      a sensor configured to provide a sensor signal being representative of a current flowing in one or more phases;
      a controlled current sink configured to supply a compensation current as a function of the sensor signal; and
      an active amplifier element configured to provide a frequency response of an open circuit voltage amplification and/or to supply a maximal output current,
   wherein the frequency response differs from a frequency response of at least one other active amplifier and/or wherein the maximal output current differs from a maximal output current of at least one other active amplifier,
   wherein the active compensation circuit is configured to be coupled to a power network and an electric installation,
   wherein the power network and the electric installation are coupled directly or indirectly via the one or more phases, and
   wherein the active compensation circuit is configured to suppress common mode interference.

2. The active compensation circuit according to claim 1, further comprising:
   an input for direct or indirect coupling to a load side, the load side comprising the electric installation; and
   an output for direct or indirect coupling to a network side, the network side comprising the power network,
   wherein the first compensation stage and the at least one other compensation stage are arranged cascaded between the input and the output.

3. The active compensation circuit according to claim 2, wherein the first compensation stage is coupled to the input and forms an input stage of the active compensation circuit, and wherein the active amplifier element of the first compensation stage is configured to supply a higher maximal output current than the active amplifier element of the at least one other compensation stage.

4. The active compensation circuit according to claim 2, wherein the at least one other compensation stage is coupled to the output and forms an output stage of the active compensation circuit, and wherein the active amplifier element of the at least one other compensation stage has a greater bandwidth of the open circuit voltage amplification.

5. The active compensation circuit according to claim 1, wherein each sensor of the first compensation stage and the at least one other compensation stage comprises a current transformer configured to provide the sensor signal, which is representative of a total current, which flows in a predetermined measuring region of the sensor through the one or more phases.

6. The active compensation circuit according to claim 5, wherein the current transformer has a summation current transformer and the total current forms a sum of individual leakage currents that flow in individual phases.

7. The active compensation circuit according to claim 1, wherein each of the first compensation stage and the at least one other compensation stage is configured to supply a compensation current such that with regard to a total current, which flows in a predetermined measuring region of the sensor through the one or more phases, the compensation current being phase-shifted by approximately 180° or phase-shifted by 180° and having approximately the same amplitude or the same amplitude.

8. The active compensation circuit according to claim 1, wherein each sensor has a first sensor connection and a second sensor connection, and wherein each controlled current sink has a load resistor, which is coupled between the first sensor connection and the second sensor connection and which represents a load of a current transformer.

9. The active compensation circuit according to claim 8, wherein each amplifier element comprises a voltage follower, an input voltage of which being representative of a voltage, which falls across the load resistor, and an output voltage of which being coupled via an output resistor to an output of the controlled current sink to supply the compensation current.

10. An active compensation circuit according to claim 1, wherein each of the first compensation stage and/or the at least one other compensation stage has a plurality of controlled current sinks, which are connected in parallel.

11. A system comprising:
a power network and an electric installation coupled directly or indirectly via one or more phases; and
the active compensation circuit according to claim 1,
wherein a respective output of the first compensation stage and the at least one other compensation stage is coupled directly or indirectly to the one or more phases.

12. The system according to claim 11,
wherein the active compensation circuit has an input for direct or indirect coupling to a load side, the load side comprising the electric installation, and an output for direct or indirect coupling to a network side, the network side comprising the power network, and
wherein the first compensation stage and the at least one other compensation stage are arranged cascaded between the input and the output of the active compensation circuit.

13. The system according to claim 12, wherein the first compensation stage is coupled to the input of the active compensation circuit and forms an input stage of the active compensation circuit, and wherein the active amplifier element of the first compensation stage is configured to supply a higher maximal output current than the active amplifier element of the at least one other compensation stage.

14. The system according to claim 13, wherein the at least one other compensation stage is coupled to the output and forms an output stage of the active compensation circuit, wherein the at least one other compensation stage comprises an active amplifier element that has a greater bandwidth of an open circuit voltage amplification.

15. The system according to claim 12, wherein each sensor comprises a current transformer configured to supply a sensor signal, which is representative of a total current and which flows in a predetermined measuring region of the sensor through the one or more phases.

16. The system according to claim 15, wherein the current transformer has a summation current transformer and a total current forms a sum of individual leakage currents that flow in individual phases.

17. The system according to claim 11, wherein each of the first compensation stage and the at least one other compensation stage is configured to supply a compensation current such that with regard to a total current, which flows in a predetermined measuring region of the sensor through the one or more phases, the compensation current is phase-shifted by approximately 180° or phase-shifted by 180° and has approximately the same amplitude or is of the same amplitude.

18. The system according to claim 11, wherein each sensor has a first sensor connection and a second sensor connection, wherein each controlled current sink has a load resistor, which is coupled between the first sensor connection and the second sensor connection and which represents a load of a current transformer.

19. The system according to claim 18, wherein each amplifier element comprises a voltage follower, an input voltage of which is representative of a voltage, which falls across the load resistor, and an output voltage of which is coupled via an output resistor to an output of the controlled current sink to supply the compensation current.

20. The system according to claim 11, wherein each of the first compensation stage and/or the at least one of the other compensation stage has a plurality of controlled current sinks that are connected in parallel.

* * * * *